United States Patent
Fukuhisa et al.

(10) Patent No.: US 6,822,989 B1
(45) Date of Patent: Nov. 23, 2004

(54) SEMICONDUCTOR LASER AND A MANUFACTURING METHOD FOR THE SAME

(75) Inventors: Toshiya Fukuhisa, Matsubara (JP); Masaya Manno, Nara (JP); Akio Yoshikawa, Kyotanabe (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/515,285

(22) Filed: Feb. 29, 2000

(30) Foreign Application Priority Data

Mar. 3, 1999 (JP) .......................................... 11-055021

(51) Int. Cl.$^7$ ................................................ H01S 5/00
(52) U.S. Cl. ........................................ 372/43; 372/46
(58) Field of Search ............................ 372/43, 45, 46; 313/499; 437/129; 438/31

(56) References Cited

U.S. PATENT DOCUMENTS

| | | | |
|---|---|---|---|
| 4,800,565 A | * 1/1989 | Yoshizawa et al. | 372/45 |
| 5,144,633 A | * 9/1992 | Ohnaka et al. | 372/45 |
| 5,146,467 A | * 9/1992 | Kadowaki et al. | 372/46 |
| 5,270,246 A | 12/1993 | Mannou et al. | |
| 5,471,494 A | 11/1995 | Mataki et al. | |
| 5,506,170 A | * 4/1996 | Yodoshi et al. | 437/129 |
| 5,776,792 A | * 7/1998 | Naito et al. | 438/31 |
| 5,933,433 A | 8/1999 | Miyashita | |
| 5,933,443 A | * 8/1999 | Mushiage et al. | 372/46 |
| 5,949,809 A | * 9/1999 | Ashida | 372/46 |
| 6,055,255 A | 4/2000 | Suyama et al. | |
| 6,081,541 A | * 6/2000 | Adachi et al. | 372/45 |
| 6,369,506 B1 | * 4/2002 | Hata | 313/499 |
| 6,373,874 B1 | * 4/2002 | Kidoguchi et al. | 372/45 |
| 6,377,596 B1 | * 4/2002 | Tanaka et al. | 372/45 |
| 6,411,637 B1 | * 6/2002 | Hashimoto | 372/45 |

FOREIGN PATENT DOCUMENTS

| | | |
|---|---|---|
| JP | 62108591 | 5/1987 |
| JP | 62186582 | 8/1987 |
| JP | 62213189 | 9/1987 |
| JP | 2154472 | 6/1990 |
| JP | 327584 | 2/1991 |
| JP | 4162483 | 6/1992 |
| JP | 5175607 | 7/1993 |
| JP | 5243667 | 9/1993 |
| JP | 5251813 | 9/1993 |
| JP | 6237038 | 8/1994 |
| JP | 908307 | 3/1997 |
| JP | 9270563 | 10/1997 |

OTHER PUBLICATIONS

Electronics Letter, Jul. 3, 1997, vol. 33, No. 14.

* cited by examiner

*Primary Examiner*—Don Wong
*Assistant Examiner*—Tuan N. Nguyen

(57) ABSTRACT

A semiconductor laser, including: an n-type cladding layer that has n-type conductivity; an active layer formed on top of the n-type cladding layer; a p-type cladding base layer that is formed on top of the active layer and has p-type conductivity; a current-blocking layer that is formed on specified parts of an upper surface of the p-type cladding base layer and substantially has n-type conductivity; and a p-type buried cladding layer that has p-type conductivity and is formed so as to cover the current-blocking layer and contact remaining parts of the upper surface of the p-type cladding base layer. The current-blocking layer has at least two regions having different concentrations (hereafter "N1" and "N2" where N1<N2) of n-type carriers, a region adjacent to an interface between the p-type cladding base layer and the p-type buried cladding layer having the N1 concentration of n-type carriers and a part or, all of a remaining region of the current-blocking layer region having the N2 concentration.

38 Claims, 5 Drawing Sheets

SEMICONDUCTOR LASER AND A MANUFACTURING METHOD FOR THE SAME

BACKGROUND OF THE INVENTION

1. Field of the Invention

The present invention relates to a semiconductor laser used as a light source in an optical disc device and to a manufacturing method for such semiconductor laser.

2. Description of the Prior Art

Optical disc drives for digital video discs (DVDs) and other such media have been developed in recent years. Of the semiconductor lasers currently available, such devices mainly use AlGaInP-type semiconductor lasers that emit laser light of a short wavelength as their light sources.

In the field of AlGaInP-type semiconductor lasers, much attention has been placed on the favorable characteristics exhibited by RISA (Real refractive Index guided Self-Aligned structure) type lasers. These have been described by Osamu Imafuji et al. on page 1223 of "Electronics Letters" Volume 33 (1997), for example.

FIG. 7 shows a cross-section of a RISA-type laser. The expressions "above" and "below" in the following explanation refer to the structure when FIG. 7 is in an upright position. The illustrated RISA-type laser has an n-type GaAs substrate 1, on which an n-type GaAs buffer layer 2, an n-type cladding layer 3 made of $(Al_xGa_{1-x})_yIn_{1-y}P$ (where x=0.7, y=0.5), an active layer 4, a p-type cladding base layer 5 made of $(Al_xGa_{1-x})_yIn_{1-y}$ (where x=0.7, y=0.5), and a current-blocking layer 6 made of AlInP are successively formed in the stated order. Etching is performed next on a stripe-shaped part of the current-blocking layer 6. Above this, a p-type buried cladding layer 7, an ohmic contact layer 8 made of p-type $Ga_{0.5}In_{0.5}P$, a cap layer 9 made of p-type GaAs are formed in the stated order. A p-type electrode 10 is formed on the cap layer 9, and an n-type electrode 11 is formed on the back of the n-type GaAs substrate 1. Note that the materials cited here are mere examples, so that other combinations of materials may be used.

As shown in FIG. 7, the p-type buried cladding layer 7 that covers the current-blocking layer 6 is buried in a groove formed in the center of the construction. This produces a current flow concentrating effect whereby the flow of current between the top and bottom of the p-type buried cladding layer 7 is narrowed. Light is confined within the n-type cladding layer 3, the p-type cladding base layer 5, and the p-type buried cladding layer 7. The current flow concentrating and light-confining effects of this construction ideally mean that laser light can be produced using a relatively low operating current.

FIG. 8 shows the manufacturing process for the above type of laser. Each layer from the n-type GaAs buffer layer 2 to the cap layer 9 is successively formed using metalorganic vapor phase epitaxy (MOVPE). In more detail, each layer up to the current-blocking layer 6 is successively formed on the n-type GaAs substrate 1 (process 1). Once the current-blocking layer 6 has been provided, a stripe is formed by etching a central part of the current-blocking layer 6. Before the p-type buried cladding layer 7 is formed, impurities (which are mainly composed of the etching solution that remains after the etching process) need to be removed from the surface of the multilayer structure formed of the n-type GaAs substrate 1 to the current-blocking layer 6. These impurities are removed by a thermal cleaning process where the multilayer structure is heated at a high temperature (generally 700° C. or higher) that is near the crystal growth temperature of the layers (process 2). To prevent phosphorous from being vaporized from the surface of the multilayer structure, a phosphorous compound such as phosphine ($PH_3$) or the like is supplied during this process. In this way, the cleaning is performed in the presence of a phosphorous compound. The remaining layers are thereafter formed using MOVPE, and the manufacturing procedure ends with the formation of the electrodes (process 3).

To improve the performance of optical disc devices in which the above laser is used, however, it is desirable to further improve the laser characteristics, such as by lowering the laser threshold current (see Optical Device Dictionary, page 8).

SUMMARY OF THE INVENTION

It is a first object of the present invention to provide a durable semiconductor laser with improved laser characteristics, such as a lowered threshold current.

It is a second object of the present invention to provide a manufacturing method for efficiently producing a durable semiconductor laser with improved laser characteristics, such as a lowered threshold current.

In order to achieve the stated objects, the inventors studied the manufacturing method of the semiconductor lasers described in the prior art, and tried to find points that could be improved. As a result, the inventors found that when thermal cleaning is performed as part of the manufacturing method of the above semiconductor laser, the etching proceeds in the horizontal direction at the joins between the current block layer and the p-type cladding base layer, creating concaves in the current-blocking layer. If the current-blocking layer is embedded and reconstructed in this state having concaves, crystal growth will not proceed in certain areas and, as shown in FIG. 7, hollows 12 will be left in the construction. While these hollows 12 may be small, they are formed along the interface between the p-type cladding base layer 5 and the current-blocking layer 6 and cause waveguide loss in the semiconductor laser. This worsens the semiconductor laser characteristics (such as by raising the threshold current) and so has made it impossible to realize an ideal semiconductor laser.

The inventors next focused on the horizontal progression of the etching that occurs at the interface between the p-type cladding base layer 5 and the current-blocking layer 6 during the thermal cleaning process in terms of the concentration of carriers in the current-blocking layer 6. As a result, the inventors discovered that the extent to which etching progresses in the horizontal direction at the interface between the p-type cladding base layer 5 and the current-blocking layer 6 has a high correlation with the concentration of carriers in the current-blocking layer 6. This discovery led to the conception of the present invention.

In order to achieve the stated first object, the present invention is a semiconductor laser, including: an n-type cladding layer that has n-type conductivity; an active layer formed on top of the n-type cladding layer; a p-type cladding base layer that is formed on top of the active layer and has p-type conductivity; a current-blocking layer that is formed on specified parts of an upper surface of the p-type cladding base layer and substantially has n-type conductivity; and a p-type buried cladding layer that has p-type conductivity and is formed so as to cover the current-blocking layer and contact remaining parts of the upper surface of the p-type cladding base layer, wherein the current-blocking layer has at least two regions having different concentrations (hereafter "N1" and "N2" where N1<N2) of n-type carriers, a region adjacent to an interface between the p-type cladding base layer and the p-type buried cladding layer having the N1 concentration of n-type carriers and a part or all of a remaining region of the current-blocking layer region having the N2 concentration.

Note that the term "substantially" used in the description of the current-blocking layer means that while one or more parts of the current-blocking layer 6 may not have a current blocking action, such action will be achieved by some other part of the current-blocking layer. This is also the case for the other independent claims.

In the semiconductor laser of the stated construction, the concentration of carriers in the current-blocking layer near the joins between the p-type cladding base layer and the p-type buried cladding layer is lower than the concentration of carriers in some or all of a remaining part of the current-blocking layer. Such other part ensures that the current narrowing effect of the current-blocking layer is maintained, even though etching is suppressed at the joins between the p-type cladding base layer and the p-type buried cladding layer during the thermal cleaning process. As a result, the hollows produced at such joins are smaller than the hollows in conventional semiconductor lasers, which lowers the threshold current and raises the slope efficiency, thereby improving the laser characteristics. Since this improved performance enables a high output to be achieved with a lower current, reliability is also improved.

It is not clear how the above reduction in the size of the hollows was achieved, but it is believed that this results from the following action.

The region of the current-blocking layer near the bottom surface that contacts the upper surface of the p-type cladding base layer has a relatively high concentration of n-type carriers. During thermal cleaning, the carriers are subjected to heat dispersion and PN junctions occur between the moved carriers. As a result, a depletion layer is formed at the interface between the p-type cladding base layer and the current-blocking layer. Charge builds up in this depletion layer, and since the layer is exposed to the gas atmosphere (such as phosphine), an electrochemical reaction occurs and the current-blocking layer is etched in the horizontal direction.

In the current-blocking layer of the present invention, the concentration of carriers in the current-blocking layer near the interface with the p-type cladding base layer and the p-type buried cladding layer is lower than part or all or the remaining region in the current-blocking layer. As a result, the depletion layer is reduced and fewer electrochemical reactions occur with the surrounding gas atmosphere during the thermal cleaning, while the current blocking action is maintained by the parts of the current-blocking layer with the higher concentration of carriers. Note that when the concentration of carriers is constant within the entire current-blocking layer, the setting of a lower concentration of carriers will similarly result in fewer electrochemical reactions during the thermal cleaning, though such current-blocking layer will not effectively narrow the flow of current in the semiconductor laser.

FIG. 2 shows the results of an investigation into the relationship between the concentration of n-type carriers in the part of the current-blocking layer that is near the upper surface of the p-type cladding base layer and the extent to which etching occurs. The black circles in FIG. 2 indicate measurements of etching speed, while the solid line shows the optimum curve. This experiment was performed for the first embodiment of the present invention, where the etching speed is measured while the concentration of n-type carriers in the part of the current-blocking layer that is near the upper surface of the p-type cladding base layer varies within the range given as 0 to $1*10^{18}$ cm$^{-3}$. Note that the values in FIG. 2 expressing the concentration of carriers are concentrations in the materials used for forming the various layers and were measured according to a C-V method.

As shown in FIG. 2, the lower the concentration of n-type carriers in part of the current-blocking layer near the upper surface of the p-type cladding base layer, the slower the etching speed, with the etching speed being virtually zero when the concentration of carriers is $1*10^{17}$ cm$^{-3}$ or below.

These results show that a reduction in the concentration of carriers in a part of the current-blocking layer near the interface with the p-type cladding base layer and the p-type buried cladding layer is effective in reducing the size of the hollows. Since the etching speed is virtually zero when the concentration of carriers is $1*10^{17}$ cm$^3$ or below in the part of the current-blocking layer near the p-type cladding base layer, setting the concentration of carriers in this range almost eradicates the hollows altogether from the structure. Note that this concentration of carriers is not the concentration in the finally produced semiconductor laser, but instead the value before thermal cleaning, although this will be substantially the same as the concentration in the finished product.

Here, the current-blocking layer may includes a first layer that contacts the p-type cladding base layer and a second layer that is provided on top of the first layer, a concentration of n-type carriers in the first layer being N1 and a concentration of n-type carriers in the second layer being N2.

With this structure, the first of the two layers has a low concentration of carriers, which suppresses etching during the thermal cleaning. The second of the two layers has a high concentration of carriers and so blocks the flow of current.

Here, the first layer may have a different composition to the second layer.

In a semiconductor laser with the above construction, the dispersion of carriers during the thermal cleaning is suppressed by the hetro interface between the first and second layers. The formation of a depletion layer at the interface with the p-type cladding base layer due to the effects of dispersed carriers is therefore suppressed, so that etching can be prevented more effectively.

Here, one of the first layer and the second layer may be composed of a plurality of sublayers that have at least two different compositions in a semiconductor laser with the above construction, the dispersion of carriers during the thermal cleaning is suppressed by the hetro interfaces between the sublayers in the first or second layer. The formation of a depletion layer at the interface with the p-type cladding base layer due to the effects of dispersed carriers is therefore suppressed, so that etching can be prevented more effectively.

In claim 4, the statement that the sublayers have "different compositions" does not simply mean that there are different concentrations of impurities, but instead can also mean that there are different metals in the respective compositions or that the compositions include different proportions of the same metals.

Here, the second layer may be co-doped with a p2 concentration of p-type carriers and an n2 (where n2>p2) concentration of n-type carriers, and n2 and p2 may be set so that n2−p2=N2.

In a semiconductor laser with the stated construction, the dispersion of carriers during the thermal cleaning is prevented within the second layer. The formation of a depletion layer at the interface with the p-type cladding base layer due to the effects of dispersed carriers is therefore suppressed, so that etching can be prevented more effectively.

The first object of the present invention can also be achieved by a semiconductor laser, including: an n-type cladding layer that has n-type conductivity; an active layer formed on top of the n-type cladding layer; a p-type cladding base layer that is formed on top of the active layer and has p-type conductivity; a current-blocking layer that is formed on specified parts of an upper surface of the p-type cladding base layer and substantially has n-type conductivity; and a p-type buried cladding layer that has p-type conductivity and is formed so as to cover the current-blocking layer and contact remaining parts of the upper surface of the p-type cladding base layer, the current-blocking layer having a region with p-type conductivity adjacent to the interface between the p-type cladding base layer and the p-type buried cladding layer and another region with n-type conductivity.

In a semiconductor laser with the stated construction, the part of the current-blocking layer near the interface with the p-type cladding base layer and the p-type buried cladding layer has p-type conductivity. As a result, a depletion layer is formed at a position within the structure that is shifted upward from the interface between the p-type cladding base layer and the current-blocking layer. During the thermal cleaning, this shifted depletion layer is positioned at some distance from the position where the gas atmosphere tends to linger, which reduces the frequency with which the depletion layer comes into contact with the gas atmosphere. This reduces the extent to which liquid-phase etching occurs, while the region of the current-blocking layer with n-type conductivity maintains the current-narrowing effect.

The first object may also be achieved by a semiconductor laser including: an n-type cladding layer that has n-type conductivity; an active layer formed on top of the n-type cladding layer; a p-type cladding base layer that is formed on top of the active layer and has p-type conductivity; an interjacent layer that has p-type conductivity and is formed on specified parts of an upper surface of the p-type cladding base layer and contacts the p-type cladding base layer; a current-blocking layer that is formed on the interjacent layer and has n-type conductivity; and a p-type buried cladding layer that has p-type conductivity and is formed so as to cover the current-blocking layer and contact remaining parts of the upper surface of the p-type cladding base layer, the interjacent layer being positioned between the current-blocking layer and the p-type cladding base layer so that a lower surface of the current-blocking layer is separated from an upper surface of the p-type cladding base layer.

Since an interjacent layer with p-type conductivity is present between the p-type cladding base layer and the current-blocking layer, a depletion layer is formed at a position within the structure that is shifted upward to an interface between the interjacent layer and the current-blocking layer. During the thermal cleaning, this shifted depletion layer is positioned at some distance from the position where the gas atmosphere tends to linger, which reduces the frequency with which the depletion layer comes into contact with the gas atmosphere. This reduces the extent to which liquid-phase etching occurs.

The second object of the present invention can be realized by a semiconductor laser manufacturing method, including: a first process for successively forming an n-type cladding layer having n-type conductivity, an active layer, and a p-type cladding base layer having p-type conductivity on top of one another, before forming a current-blocking layer, which substantially has n-type conductivity, on specified parts of an upper surface of the p-type cladding base layer; a second process for performing thermal cleaning in a presence of a specified gas after the first process has finished; a third process for forming, after the second process has finished, a p-type buried cladding layer, which has p-type conductivity, so as to cover the current-blocking layer and contact remaining parts of the upper surface of the p-type cladding base layer, the first process including: a first subprocess for forming a region of the current-blocking layer that is adjacent to the interface between the p-type cladding base layer and the p-type buried cladding layer with a concentration (hereafter, "N1") of n-type carriers; and a second subprocess for forming another region in at least part of the current-blocking layer with a concentration (hereafter, "N2") of n-type carriers, where N1<N2.

In a semiconductor laser produced by the stated manufacturing method, the concentration of carriers in the current-blocking layer near the joins between the p-type cladding base layer and the p-type buried cladding layer is lower than the concentration of carriers in some or all of a remaining part of the current-blocking layer. Such other part ensures that the current narrowing effect of the current-blocking layer is maintained, even though etching is suppressed at the joins between the p-type cladding base layer and the p-type buried cladding layer during the thermal cleaning process. As a result, the hollows produced at such joins are smaller than the hollows in conventional semiconductor lasers, which lowers the threshold current and raises the slope efficiency, thereby improving the laser characteristics. Since this improved performance enables a high output to be achieved with a lower current, reliability is also improved.

Here, the first process may produce the current-blocking layer by forming a first layer that contacts the p-type cladding base layer and a second layer on top of the first layer, a concentration of n-type carriers being N1 in the first layer and N2 in the second layer.

The stated manufacturing method produces a structure where the first of the two layers has a low concentration of carriers, which suppresses etching during the thermal cleaning. The second of the two layers has a high concentration of carriers and so blocks the flow of current.

It is preferable for the values $0 \text{cm}^{-3} \leq N1 \leq 10^{17} \text{ cm}^{-3}$ and $N2 > 10^{17} \text{cm}^{-3}$ to be used.

Here, the first process may form the first layer from a different composition of materials to the second layer.

In a semiconductor laser produced by the stated manufacturing method, the dispersion of carriers during the thermal cleaning is suppressed by the hetro interface between the first and second layers. The formation of a depletion layer at the interface with the p-type cladding base layer due to the effects of dispersed carriers is therefore suppressed, so that etching can be prevented more effectively.

Here, the first process may produce one of the first layer and the second layer by forming sublayers from at least two different compositions of materials.

In a semiconductor laser produced by the stated manufacturing method, the dispersion of carriers during the thermal cleaning is suppressed by the hetro interfaces between the sublayers in the first or second layer. The formation of a depletion layer at the interface with the p-type cladding base layer due to the effects of dispersed carriers is therefore suppressed, so that etching can be prevented more effectively.

Here, the first process may co-dope the second layer with a p2 concentration of p-type carriers and an n2 (where n2>p2) concentration of n-type carriers, where N2=(n2−p2)

In a semiconductor laser produced by the stated manufacturing method, the dispersion of carriers during the thermal cleaning is prevented within the second layer. The formation of a depletion layer at the interface with the p-type cladding base layer due to the effects of dispersed carriers is therefore suppressed, so that etching can be prevented more effectively.

The second object of the present invention can also be realized by a semiconductor laser manufacturing method, including: a first process for successively forming an n-type cladding layer having n-type conductivity, an active layer, and a p-type cladding base layer having p-type conductivity on top of one another, before forming a current-blocking layer, which substantially has n-type conductivity, on specified parts of an upper surface of the p-type cladding base layer; a second process for performing thermal cleaning in a presence of a specified gas after the first process has finished; a third process for forming, after the second process has finished, a p-type buried cladding layer, which has p-type conductivity, so as to cover the current-blocking layer and contact remaining parts of the upper surface of the p-type cladding base layer, the first process forming the current-blocking layer so as to include a region with n-type conductivity and a region with p-type conductivity, the first process including: a first subprocess for forming a region with p-type conductivity adjacent to an interface between the p-type cladding base layer and the p-type buried cladding layer; and a second subprocess for forming a region with n-type conductivity in at least part of a remainder of the current-blocking layer.

In a semiconductor laser produced by the stated manufacturing method, the part of the current-blocking layer near the interface with the p-type cladding base layer and the p-type buried cladding layer has p-type conductivity. As a result, a depletion layer is formed at a position within the structure that is shifted upward from the interface between the p-type cladding base layer and the current-blocking layer. During the thermal cleaning, this shifted depletion layer is positioned at some distance from the position with the gas atmosphere tends to linger, which reduces the frequency with which the depletion layer comes into contact with the gas atmosphere. This reduces the extent to which liquid-phase etching occurs, while the region of the current-blocking layer with n-type conductivity maintains the current-narrowing effect.

The second object of the present invention can also be realized by a semiconductor laser manufacturing method, including: a first process for successively forming an n-type cladding layer having n-type conductivity, an active layer, a p-type cladding base layer having p-type conductivity, and an interjacent layer that has p-type conductivity and contacts the first p-type cladding base layer on top of one another, before forming a current-blocking layer, which substantially has n-type conductivity, on an upper surface of the interjacent layer; a second process for performing thermal cleaning in a presence of a specified gas after the first process has finished; a third process for forming, after the second process has finished, a p-type buried cladding layer, which has p-type conductivity, so as to cover the current-blocking layer and contact remaining parts of the upper surface of the p-type cladding base layer, the interjacent layer being formed between the current blocking layer and the p-type cladding base layer so that a lower surface of the current-blocking layer is separated from an upper surface of the p-type cladding base layer.

In a semiconductor laser produced by the stated manufacturing method, an interjacent layer with p-type conductivity is present between the p-type cladding base layer and the current-blocking layer. As a result, a depletion layer is formed at a position within the structure that is shifted upward to an interface between the interjacent layer and the current-blocking layer. During the thermal cleaning, this shifted depletion layer is positioned at some distance from the position with the gas atmosphere tends to linger, which reduces the frequency with which the depletion layer comes into contact with the gas atmosphere. This reduces the extent to which liquid-phase etching occurs.

BRIEF DESCRIPTION OF THE DRAWINGS

These and other objects, advantages and features of the invention will become apparent from the following description taken in conjunction with the accompanying drawings which illustrate a specific embodiment of the invention. In the drawings.

DESCRIPTION OF THE PREFERRED EMBODIMENTS

The following describes several preferred embodiments of the present invention, with reference to the attached figures.

First Embodiment

Figure 1:
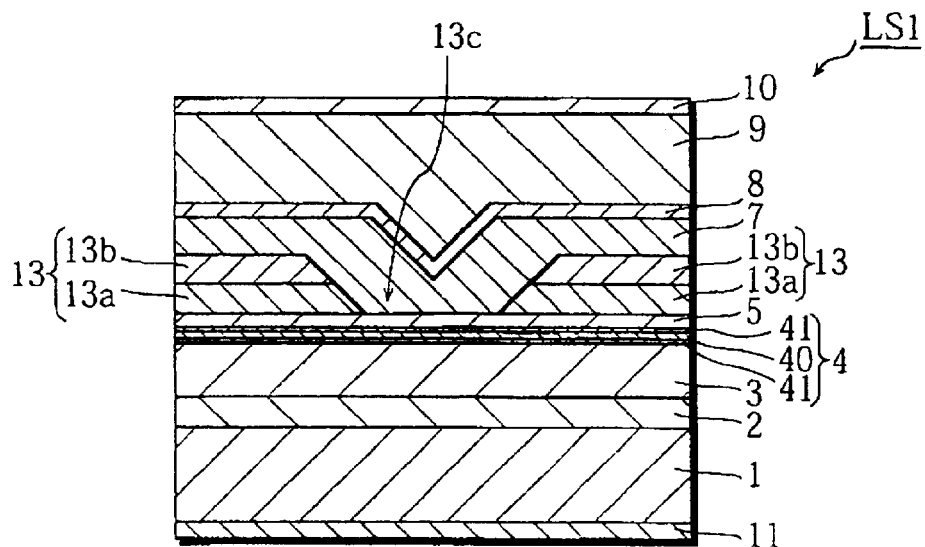
FIG. 1 shows a cross-section of a semiconductor laser LS1 that is a first embodiment of the present invention.

FIG. 1 shows a cross-section of a semiconductor laser LS1 that is a first embodiment of the present invention. Components that are the same as those shown in FIG. 7 have been given the same numerals.

As shown in FIG. 1, the semiconductor laser LS1 has an n-type GaAs substrate 1, on which an n-type GaAs buffer layer 2, an n-type cladding layer 3 made of $(Al_xGa_{1-x})_yIn_{1-y}P$ (where x=0.7, y=0.5), an active layer 4, a p-type cladding base layer 5 made of $(Al_xGa_{1-x})_yIn_{1-y}P$ (where x=0.7, y=0.5), and a current-blocking layer 13 are successively formed in the stated order. A stripe is etched along the center of the current-blocking layer 13. Above this, a p-type buried cladding layer 7 composed of $(Al_xGa_{1-x})_yIn_{1-y}P$ (where x=0.7, y=0.5), an ohmic contact layer 8 of p-type $Ga_{0.5}In_{0.5}P$ to lower the contact resistance with the electrode, and a cap layer 9 of p-type GaAs to further lower the contact resistance and diffuse heat (i.e., act as a heat sink) are formed in the stated order. A p-type electrode 10 is formed on the cap layer 9, while an n-type electrode 11 is formed on the back of the n-type GaAs substrate 1.

The n-type GaAs substrate 1 has a (100) oriented crystal surface having a 10° misorientation toward a (011) direction.

The buffer layer 2 is provided since forming the n-type cladding layer 3 directly on top of the n-type GaAs substrate 1 would result in the n-type cladding layer 3 reflecting the crystal defects in the n-type GaAs substrate 1. These defects are absorbed by the buffer layer 2.

The active layer 4 is a thin layer composed of a light-emitting layer 40 and guide layers 41 provided both on both sides (i.e., above and below) the light-emitting layer 40. The light-emitting layer 40 is composed of a predetermined thickness, such as 5 nm, of $(Al_{0.5}Ga_{0.5})_{0.5}In_{0.5}P$ as a barrier layer and two well layers made of a predetermined thickness, such as 6 nm, of $Ga_{0.43}In_{0.57}N$ that are respectively provided above and below the barrier layer. The guide layers 41 are made of a predetermined thickness (such as 50 nm) of $(Al_{0.5}Ga_{0.5})_{0.5} In_{0.5}P$ that is positioned so as to contact the two well layers whose refractive index for laser light is lower than that of the active layer 4. At room temperature, the oscillation wavelength for this laser is 660 nm.

The p-type cladding base layer 5 is a thin layer with a flat surface.

The p-type buried cladding layer 7 is a thin layer that covers the sloping faces and tops of the current-blocking layer 13 and is embedded in the groove 13c formed between the left and right parts of the current-blocking layer 13.

The p-type electrode 10 is composed of the following three metal layers in order of proximity to the cap layer 9: a chromium layer of a specified thickness, such as 50 nm; a gold layer of a specified thickness, such as 500 nm; and a platinum layer of a specified thickness, such as 100 nm.

The n-type electrode 11 is composed of the following three metal layers in order of proximity to the n-type GaAs substrate 1: a nickel layer of a specified thickness, such as 50 nm; a germanium layer of a specified thickness, such as 50 nm; and a gold layer of a specified thickness, such as 500 nm.

The current-blocking layer 13 is a thin layer that is formed on the p-type cladding base layer 5, though not at its center. This current-blocking layer 13 cuts off the downward flow of current from the outer parts of the p-type buried cladding layer 7, thereby restricting the area of the p-type buried cladding layer 7 through which current may flow.

In a semiconductor laser with the above construction, holes are supplied from the p-type electrode 10 and electrons are supplied from the n-type electrode 11. The active layer 4 forms a PN junction, so light-producing oscillation occurs.

The light produced in the active layer 4 is confined by the structure composed of the n-type cladding layer 3, the p-type cladding base layer 5, and the p-type buried cladding layer 7, and is amplified to laser light by stimulated emission. This laser light is guided along the guide layers 41 of the active layer 4 to the outside. The confinement of light by forming the layers above and below the active layer 4 from materials with a low refractive index for light is a conventional technique and so will not be described in detail here.

Since the current-blocking layer 13 is formed of a material whose refractive index for laser light is lower than those of the p-type cladding base layer 5 and the p-type buried cladding layer 7, most of the laser light emitted by the active layer 4 propagates to the p-type buried cladding layer 7 and so is confined by the p-type buried cladding layer 7 and the n-type cladding layer 3. This confining action improves the threshold current characteristics of the semiconductor laser, and makes laser emission possible with a lower operating current.

The provision of the current-blocking layer 13 has a further effect in that the current path between the p-type buried cladding layer 7 and the p-type cladding base layer 5 is narrowed, thereby concentrating the flow of current into the central gap. As the PN junctions are concentrated in the central part of the active layer 4, laser light can be emitted using a lower operating current.

However, since the narrowing of the current path results in light being mainly emitted in the central part of the active layer 4, the laser needs to be constructed so that the emitted laser light spreads out horizontally to a certain degree to unify the lateral mode of the laser light.

In addition to acting so as to confine laser light emitted by the active layer 4 in the vertical direction, the p-type cladding base layer 5 that is formed so as to cover the entire upper surface of the active layer 4 functions so as to unify the lateral mode of the laser light by enabling the light to propagate in the horizontal direction.

The following is a detailed description of the current-blocking layer 13 that forms the crux of the present invention.

The current-blocking layer 13 is formed of a first layer 13a, which is formed on top of the p-type cladding base layer 5, and a second layer 13b that is formed on top of the first layer 13a. This second layer 13b acts so as to effectively cut off the downward flow of current from the p-type buried cladding layer 7. The characteristic features of the current-blocking layer 13 are described in detail later in this specification.

The first layer 13a is non-doped and is composed of a specified thickness, such as 300 nm, of $Al_{0.5}In_{0.5}P$ whose refractive index is lower than those of the p-type cladding base layer 5 and the p-type buried cladding layer 7. The second layer 13b is n-type, and also composed of a specified thickness (such as 300 nm) of $Al_{0.5}In_{0.5}P$ whose refractive index is lower than those of the p-type cladding base layer 5 and the p-type buried cladding layer 7.

In order to have the insulating action described above, the concentration of n-type carriers (electrons) in second layer 13b is set at $1*10^{-18}$ cm$^{-3}$. By setting the concentration of carriers in this way, carriers (holes) from outer parts the p-type buried cladding layer 7 will combine with carriers (electrons) present in the second layer 13b. This eradicates the holes, so that the current paths that pass from the p-type buried cladding layer 7 to the p-type cladding base layer 5 via the current-blocking layer 13 are effectively cut off. If the concentration of carriers in the second layer 13b is too low, the heating process that follows the formation of the p-type buried cladding layer 7 can result in carriers (holes) in the p-type buried cladding layer 7 that have the opposite polarity to the carriers in the second layer 13b being dispersed into the second layer 13b. This would reduce the concentration of n-type carriers in the second layer 13b and lessen the second layer 13b's effect of narrowing the current path. Accordingly, a concentration of above $1*10^{17}$cm$^{-3}$ should be used, with a concentration of at least $1*10^{18}$ cm$^{-3}$ being preferable.

Since the first layer 13a is non-doped, it does not capture carriers like the second layer 13b. However, the first layer 13a serves a different and important purpose that is characteristic of the present invention.

Figure 8:
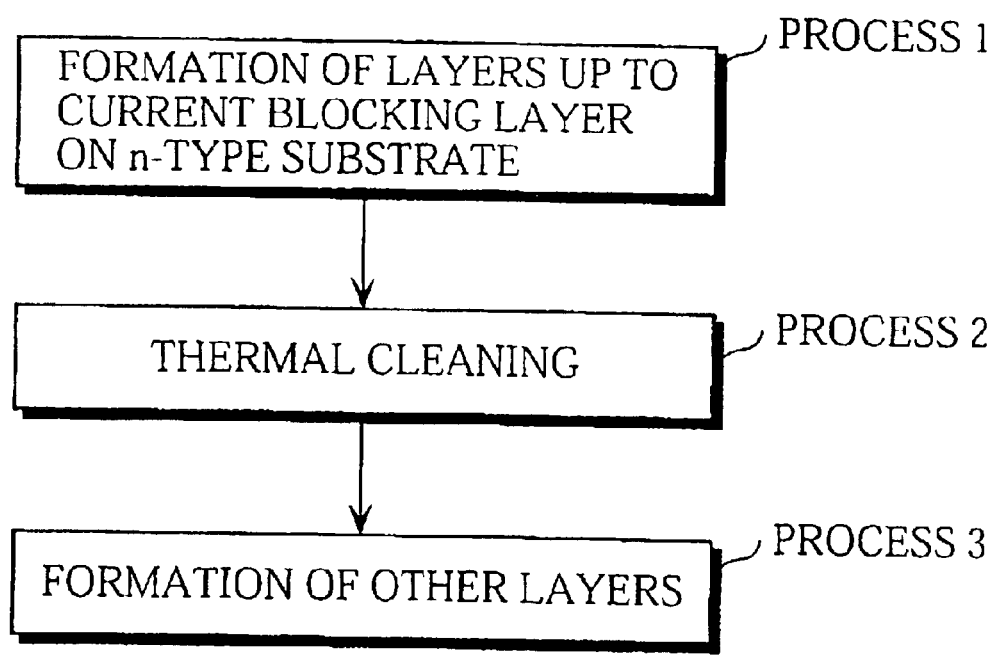
FIG. 8 shows an overview of the procedure used manufacturer a RISA-type semiconductor laser of both the conventional art and the present invention.

The semiconductor laser of the described construction is manufactured according to the procedure shown in FIG. 8. In this procedure, the n-type buffer layer 2, the n-type cladding layer 3 . . . etc. are successively formed on top of the n-type GaAs substrate 1 according to an MOVPE method. When doing so, specified amounts of certain impurities are introduced so as to set the concentration of carriers in each layer. By doing so, the material that forms each layer is changed.

After the current-blocking layer 13 has been formed on top of the p-type cladding base layer 5 and before the p-type buried cladding layer 7 is embedded, thermal cleaning is performed to remove impurities that are present on the surface of the p-type cladding base layer 5.

When a conventional current-blocking layer is made, the periphery of the lower surface of the current-blocking layer that is in contact with the upper surface of the p-type cladding base layer 5 is subjected to gas-phase etching in the horizontal direction by the gas environment (such as phosphine) used in the thermal cleaning.

With the present embodiment, however, the part of the current-blocking layer 13 that is in contact with the p-type cladding base layer 5 is the non-doped first layer 13a. This limits of the gas-phase etching of the current-blocking layer 13.

As a result, the semiconductor laser LS1 that is finally produced will have smaller hollows at the joins between the p-type cladding base layer 5, the p-type buried cladding layer 7 and the current-blocking layer 13 than a conventional laser. This result is confirmed when a cross-section of the semiconductor laser LS1 is observed under a microscope.

Figure 3:
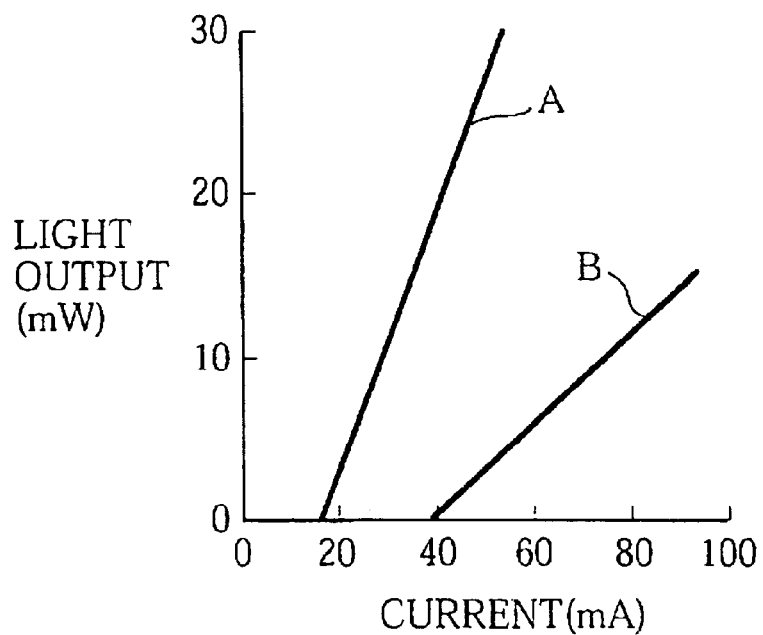
FIG. 3 is a graph showing the current-light output characteristics of the semiconductor laser LS1.

The results into an investigation into the current-light emission characteristics of the semiconductor laser LS1 are shown in FIG. 3. Note that these results are for the case where each layer has the thickness and concentration of carriers shown in Table 1. Line A in FIG. 3 shows the characteristics of the semiconductor laser of the present embodiment, while line B shows the characteristics of a conventional semiconductor laser as a comparative example.

TABLE 1

| Name | Carrier Concentration (cm$^{-3}$) | Thickness |
|---|---|---|
| cap layer 9 | 5 * 10$^{18}$ | 4 μm |
| contact layer 8 | 2 * 10$^{18}$ | 50 nm |
| p-type buried cladding layer 7 | 1 * 10$^{18}$ | 1.3 μm |
| second layer 13b | 1 * 10$^{18}$ | 300 nm |
| first layer 13a | 0 | 300 nm |
| p-type cladding base layer 5 | 3 * 10$^{18}$ | 250 nm |
| active layer 4 | non-doped | 25 nm |
| n-type cladding layer 3 | 1 * 10$^{18}$ | 15 μm |
| n-type buffer layer 2 | 1 * 10$^{18}$ | 300 nm |
| n-type GaAs substrate 1 | 1 * 10$^{18}$ | 350 μm |

Note that the values in Table 1 showing the concentration of carriers apply to the materials used to form the layers in the present embodiment, and were obtained by measurements made using a C-V method.

As can be understood from FIG. 3, the semiconductor laser of the present embodiment has a lower oscillation threshold current and a better slope efficiency than a conventional semiconductor laser. This is because when the p-type buried cladding layer 7 of the present embodiment is reformed, there will be no parts of the p-type buried cladding layer 7 where crystal growth cannot proceed. Waveguide loss is reduced, thereby improving the characteristics of the semiconductor laser.

Figure 2:
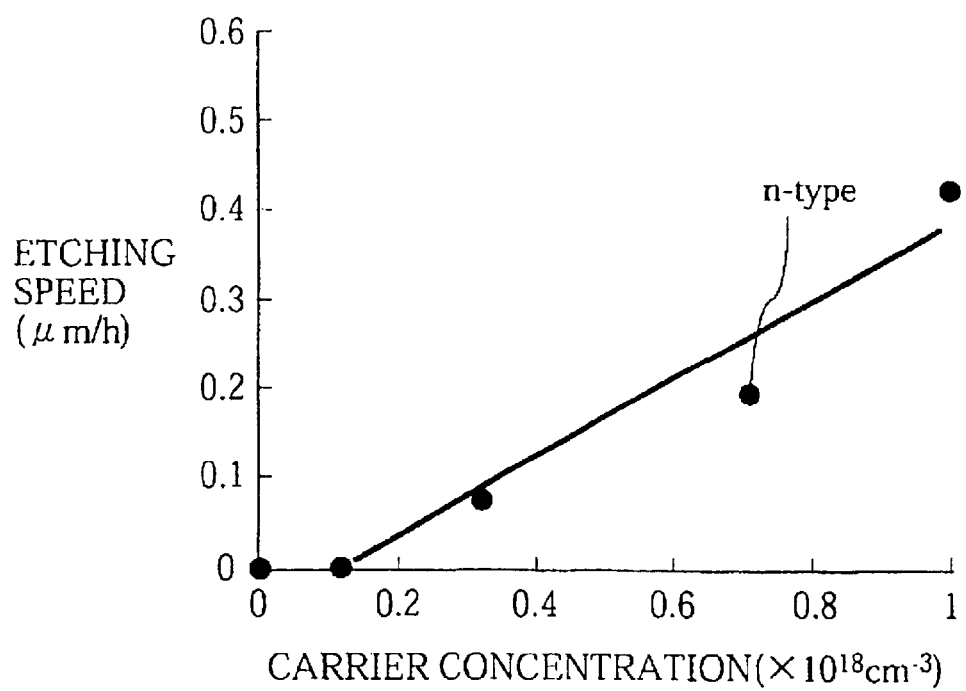
FIG. 2 is a graph showing the relationship between concentration of carriers in the part of the current-blocking layer that contacts the p-type cladding base layer and the etching speed.

Note that while the above explanation states that the first layer 13a is non-doped, this should not be construed as a limitation for the present invention, provided of course such doping does not affect the reduction in the size of the hollows that are conventionally produced at the joins between the p-type cladding base layer 5, the p-type buried cladding layer 7 and the current-blocking layer 13. The etching speed depends on the concentration of carriers and the effect described above (which is not possible with a conventional current-blocking layer having an even concentration of carriers) can only be achieved if the first layer 13a has a lower concentration of carriers than the second layer 13b, which in the above example means below 1*10$^{18}$cm$^{-3}$ A concentration no greater than 1*10$^{17}$cm$^{-3}$, where as shown in FIG. 2 the etching speed almost reaches zero, is preferable.

While the current-blocking layer 13 described above has a two-layer composition made up of the first layer 13a and the second layer 13b, this is not a limitation for the present embodiment. It is sufficient for the parts of the current-blocking layer that are near the interface between the p-type cladding base layer 5 and the p-type buried cladding layer 7 to be non-doped, with some or all other parts of the current-blocking layer 13 having a high concentration of n-type carriers. When using such a construction, the current-blocking layer 13 may be formed using a non-doped material and a doped material. When a region of high carrier concentration is created in the current-blocking layer, such region needs to be provided in a belt-like form horizontally across almost the entire current-blocking layer 13 and cover a given area, if the region is to have a current-blocking effect.

In the same way, while the above description states the first layer 13a and the second layer 13b are both formed of Al$_{0.5}$In$_{0.5}$P, the same effects can be obtained if (Al$_x$Ga$_{1-x}$)$_y$In$_{1-y}$P (where 0.7<x<1, y=0.5) is used instead.

Finally, it is not necessary for the first layer 13a and the second layer 13b of the current-blocking layer 13 to be formed of the same composite of impurity-free metal elements. These layers may be formed of composites having different proportions of the same metal elements or composites including different metal elements. In this case, the dispersion of carriers from the second layer 13b during the thermal cleaning can be stopped at the hetro interface between the first layer 13a and the second layer 13b. The formation of a depletion layer at the interface with the p-type cladding base layer 5 by the carriers dispersed in the first layer 13a can be prevented, and the etching can be suppressed. Note that the dispersion of carriers can be more effectively suppressed using the technology described in the second embodiment below.

Second Embodiment

This second embodiment of the present invention differs from the first embodiment only in the composition of the first layer 13a. The remaining parts of the construction are the same, so that the following description will focus on this difference.

In the semiconductor laser LS2 of this second embodiment, the first layer 13a of the current-blocking layer 13 has a multilayer block structure including a number of hetero interfaces. These hetero interfaces stop the dispersion of carriers, which in turn stops the formation of a depletion layer at the interface with the p-type cladding base layer 5 due to the effects of dispersed carriers. In this way, etching is more effectively suppressed than in the first embodiment.

The following describes the composition of the semiconductor laser LS2 in more detail.

Figure 4:
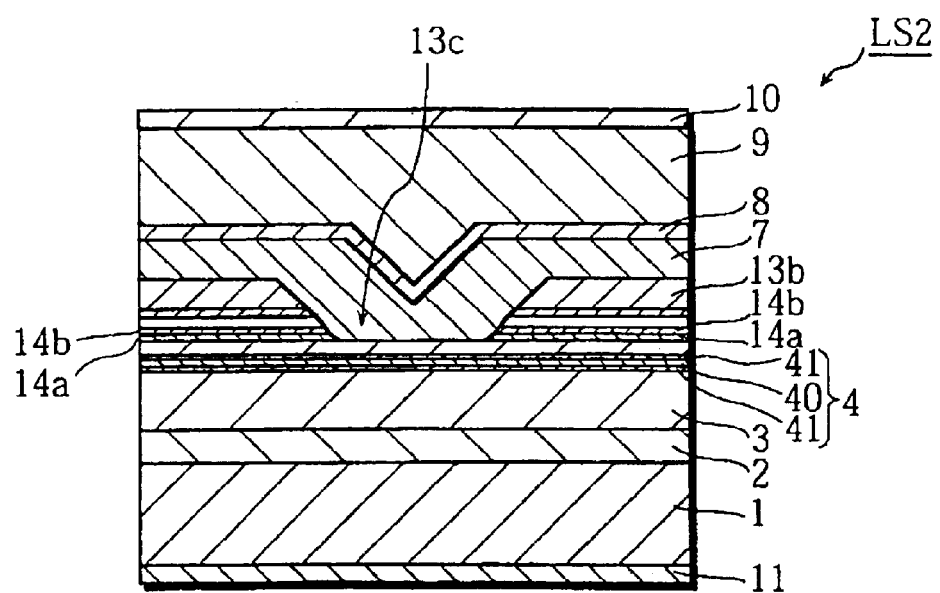
FIG. 4 is a cross-sectional drawing showing the construction of the semiconductor laser LS2 in the second embodiment.

FIG. 4 is a cross-sectional drawing showing the construction of the semiconductor laser LS2. In this structure, a first layer 14 is made up of a total of thirty sublayers 14a and 14b. These sublayers 14a and 14b are alternately arranged with the sublayer closest to the p-type cladding base layer 5 being a sublayer 14a. Each sublayer 14a is formed of a specified thickness, such as 5 nm, of non-doped $Al_{0.5}In_{0.5}P$, while each sublayer 14b is formed of a specified thickness, such as 5 nm, of non-doped $(Al_xGa_{1-x})_yIn_{1-y}P$ (where x=0.7, y=0.5). By forming the first layer 14 in this way, a large number of hetero interfaces are created between the sublayers 14a and 14b, so that the dispersion of carriers from the second layer 13b into the first layer 14 during the thermal cleaning can be effectively suppressed. The resulting semiconductor laser LS2 of the present embodiment therefore has even smaller hollows at the joins between the p-type cladding base layer 5, the p-type buried cladding layer 7 and the current-blocking layer 13 than the first embodiment which itself is an improvement of conventional semiconductor lasers.

Note that while this embodiment states that only the first layer has a multilayer block structure, the second layer may also have a multilayer block structure.

The above description also states that the first layer is composed of sublayers formed of combinations of different metal elements, although this is not a limitation and the sublayers may be formed of combinations of the same metal elements in different proportions.

Finally, while the above description states that the first layer 14 is composed of two kinds of sublayer, the first layer 14 may be composed of a larger number of different kinds of sublayer.

Third Embodiment

This third embodiment of the present invention differs from the first embodiment only in the composition of the second layer 13b. The remaining parts of the construction are the same, so that the following description will focus on this difference.

Figure 5:
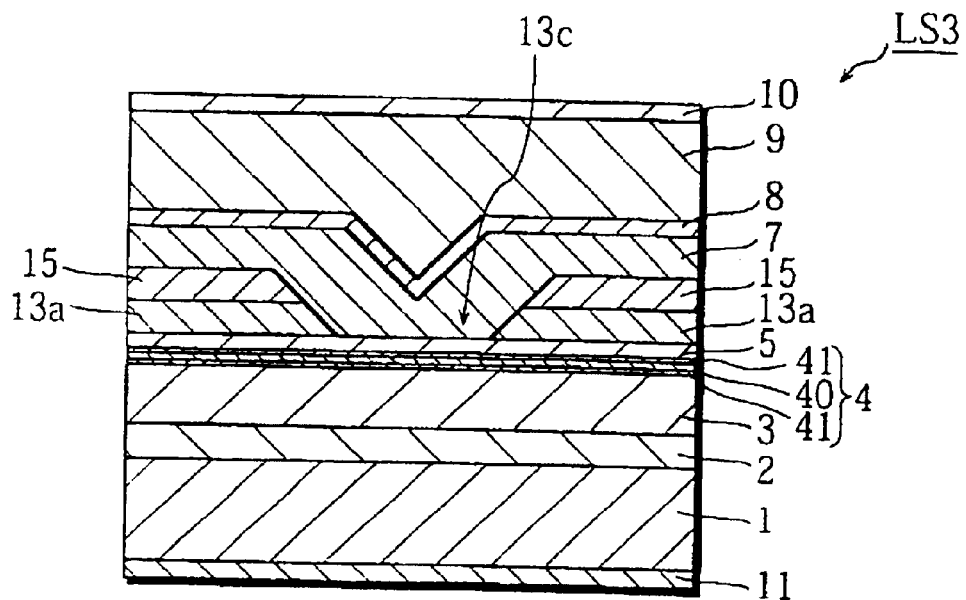
FIG. 5 is a cross-sectional drawing showing the construction of the semiconductor laser LS3 in the third embodiment.

FIG. 5 is a cross-sectional drawing showing the construction of the semiconductor laser LS3.

In the semiconductor laser LS3 of the present embodiment, both p-type impurities and n-type impurities are doped into a co-doped blocking layer 15 that corresponds to the second layer 13b of the current-blocking layer 13.

The dispersion of carriers towards the interface between the current-blocking layer 13 and the p-type cladding base layer 5 can be prevented. As a result, the formation of a depletion layer at the interface with the p-type cladding base layer 5 and the current-blocking layer 13 due to the effects of dispersed carriers can be prevented, meaning that etching can be more effectively suppressed. The resulting semiconductor laser LS3 of the present embodiment therefore has even smaller hollows at the joins between the p-type cladding base layer 5, the p-type buried cladding layer 7 and the current-blocking layer 13 than the first embodiment which itself is an improvement of conventional semiconductor lasers.

In this embodiment, the concentration of carriers that are doped into the co-doped blocking layer 15 is assumed to be $2*10^{18}$ cm$^{-3}$ for n-type carriers and $1*10^{18}$ cm$^{-3}$ for p-type carriers. The concentration of n-type carriers is set higher than the concentration of p-type carriers for the following reason. As described earlier, the co-doped blocking layer 15 needs to function as an current-blocking layer and so needs to have the reverse polarity (n) to the p-type buried cladding layer 7. By making the co-doped blocking layer 15 n-type in this way, there will be a $1*10^{18}$ cm$^{-3}$ excess concentration of n-type carriers in the co-doped blocking layer 15, and the p-type carriers and n-type carriers will share crystallization sites, thereby restricting each other's movement. In this way, the dispersion of carriers during heat treatment is suppressed.

Fourth Embodiment

This fourth embodiment of the present invention differs from the first embodiment only in the composition of the first layer. The remaining parts of the construction are the same, so that the following description will focus on this difference.

In the semiconductor laser of the present embodiment, the first layer in the current-blocking layer is formed of p-type $Al_{0.5}In_{0.5}P$. This has the effect that the locations where a depletion layer is generated during the thermal cleaning procedure are shifted upward from the interface of the p-type cladding base layer 5 and the first layer 16, decreasing the frequency with which the surrounding gas atmosphere comes into contact with the depletion layer. This makes it possible to lessen the electrochemical reaction due to contact with the surrounding gas, and completely suppresses the formation of hollows at the interface between the p-type cladding base layer 5 and the current-blocking layer 13.

Figure 7:
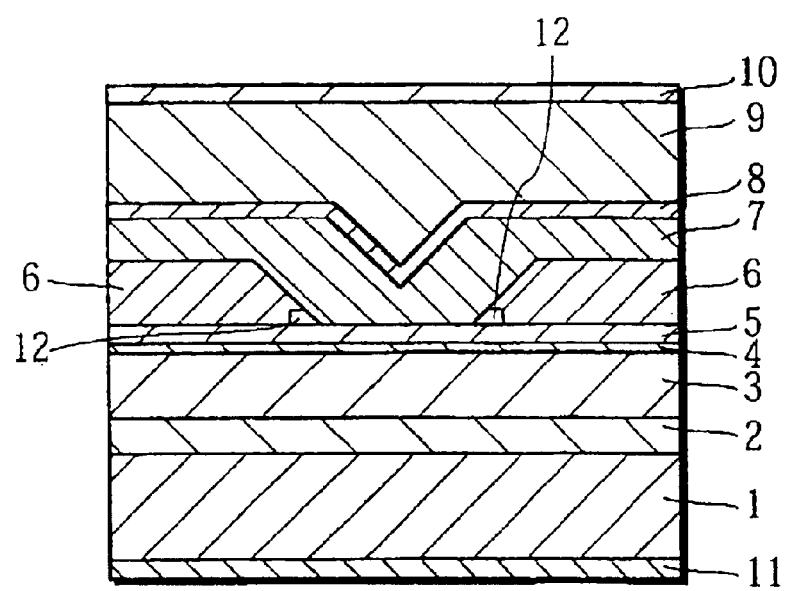
FIG. 7 is a cross-sectional drawing showing the construction of a conventional semiconductor laser.

As shown in FIG. 7, the hollows 12 are formed at the interface between the p-type cladding base layer 5 and the current-blocking layer 6 close to the active layer, thereby causing waveguide loss. It is believed that there would be less effect on waveguide loss if the hollows were formed at a higher position in the structure. Also, even if some etching occurs at the interface between the first and second layers, material will also be supplied to the etched parts when the p-type buried cladding layer 7 is formed, so that as crystallization proceeds no hollows will remain.

The following describes this effect with reference to the drawings.

Figure 6:
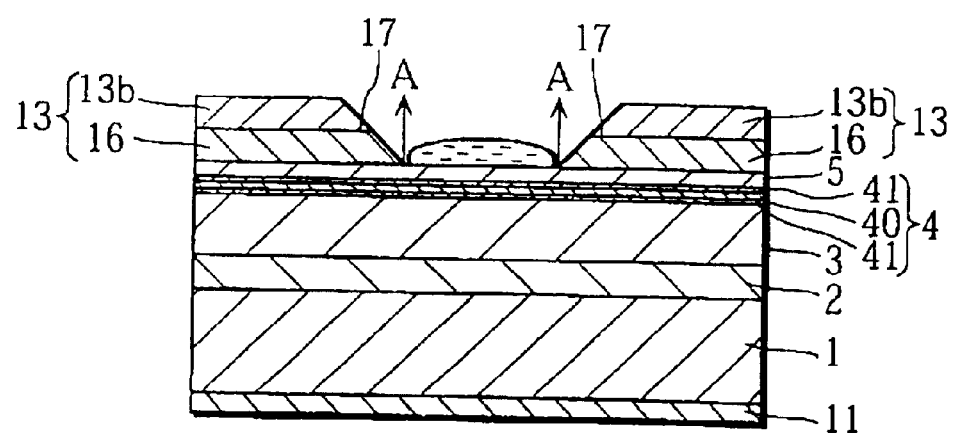
FIG. 6 is a figure showing the effect of the semiconductor laser LS4 in the fourth embodiment.

FIG. 6 is a cross-sectional figure showing a midpoint in the construction of an semiconductor laser that will be used to describe this effect.

In FIG. 6, the first layer 16 is p-type, so that a depletion layer 17 is formed at the interface between the first layer 16 and the n-type second layer 13b during thermal cleaning. In effect, this means that the position at which the depletion layer is formed is shifted upward from the interface between the p-type cladding base layer 5 and the current-blocking layer 13 (the position shown as A in FIG. 6). As the depletion layer 17 is formed at a position away from the interface between the p-type cladding base layer 5 and the current-blocking layer 13, the depletion layer comes into contact with the gas atmosphere (phosphine or the like) that remains at the bottom of the groove 13c formed in the current-blocking layer 13 with a lower frequency.

Note that while the above description states that the polarity of the first layer 13a is p-type, this is not a limitation and only the part near the interface of the p-type cladding base layer 5 and the p-type buried cladding layer 7 needs to be p-type.

Although the present invention has been fully described by way of examples with reference to accompanying drawings, it is to be noted that various changes and modifications will be apparent to those skilled in the art. Therefore, unless such changes and modifications depart from the scope of the present invention, they should be construed as being included therein.

What is claimed is:

1. A semiconductor laser, comprising:
an n-type cladding layer that has n-type conductivity;
an active layer formed on top of the n-type cladding layer;
a p-type cladding base layer that is formed on top of the active layer and has p-type conductivity;
a current-blocking layer that is formed on specified parts of an upper surface of the p-type cladding base layer and substantially has n-type conductivity, wherein the current-blocking layer includes either $Al_{0.5}In_{0.5}P$ or $(Al_xGa_{1-x})_{0.5}In_{0.5}P$, where $0.7<x<1$; and
a p-type buried cladding layer that has p-type conductivity and is formed so as to cover the current-blocking layer and contact remaining parts of the upper surface of the p-type cladding base layer,
wherein the current-blocking layer has at least two regions having different concentrations (hereafter "N1" and "N2" where N1<N2) of n-type carriers, a region adjacent to an interface between the p-type cladding base layer and the p-type buried cladding layer having the N1 concentration of n-type carriers and a part or all of a remaining region of the current-blocking layer region having the N2 concentration, and the current-blocking layer (13) having a lower refractive index than the cladding base layer (5) and the buried cladding layer (7).

2. A semiconductor laser according to claim 1, wherein the current-blocking layer includes a first layer that contacts the p-type cladding base layer and a second layer that is provided on top of the first layer, a concentration of n-type carriers in the first layer being N1 and a concentration of n-type carriers in the second layer being N2.

3. A semiconductor laser according to claim 2, wherein the first layer has a different composition to the second layer.

4. A semiconductor laser according to claim 2, wherein one of the first layer and the second layer is composed of a plurality of sublayers that have at least two different compositions.

5. A semiconductor laser according to claim 2, wherein the second layer is co-doped with a p2 concentration of p-type carriers and an n2 (where n2>p2) concentration of n-type carriers, and n2 and p2 are set so that n2−p2=N2.

6. A semiconductor laser according to claim 5, wherein $0 cm^{-3} \leq N1 \leq 10^{17} cm^{-3}$ and $N2>10^{17} cm^{-3}$.

7. A semiconductor laser according to claim 4, wherein $0 cm^{-3} \leq N1 \leq 10^{17} cm^{-3}$ and $N2>10^{17} cm^{-3}$.

8. A semiconductor laser according to claim 3, wherein $0 cm^{-3} \leq N1 \leq 10^{17} cm^{-3}$ and $N2>10^{17} cm^{-3}$.

9. A semiconductor laser according to claim 2, wherein $0 cm^{-3} \leq N1 \leq 10^{17} cm^{-3}$ and $N2>10^{17} cm^{-3}$.

10. A semiconductor laser according to claim 1, wherein $0 cm^{-3} \leq N1 \leq 10^{17} cm^{-3}$ and $N2>10^{17} cm^{-3}$.

11. A semiconductor laser, comprising:
an n-type cladding layer that has n-type conductivity;
an active layer formed on top of the n-type cladding layer;
a p-type cladding base layer that is formed on top of the active layer and has p-type conductivity;
a current-blocking layer that is formed on specified parts of an upper surface of the p-type cladding base layer and substantially has n-type conductivity, wherein the current-blocking layer includes either $Al_{0.5}In_{0.5}P$ or $(Al_xGa_{1-x})_{0.5}In_{0.5}P$, where $0.7<x<1$; and
a p-type buried cladding layer that has p-type conductivity and is formed so as to cover the current-blocking layer and contact remaining parts of the upper surface of the p-type cladding base layer,
the current-blocking layer having a region with p-type conductivity adjacent to the interface between the p-type cladding base layer and the p-type buried cladding layer and another region with n-type conductivity, and the current-blocking layer (13) having a lower refractive index than the p-type cladding base layer (5) and the p-type buried cladding layer (7).

12. A semiconductor laser, comprising:
an n-type cladding layer that has n-type conductivity;
an active layer formed on top of the n-type cladding layer;
a p-type cladding base layer that is formed on top of the active layer and has p-type conductivity;
an interjacent layer that has p-type conductivity and is formed on specified parts of an upper surface of the p-type cladding base layer and contacts the p-type cladding base layer;
a current-blocking layer that is formed on the interjacent layer and has n-type conductivity, wherein the current-blocking layer includes either $Al_{0.5}In_{0.5}P$ or $(Al_xGa_{1-x})_{0.5}In_{0.5}P$, where $0.7<x<1$; and
a p-type buried cladding layer that has p-type conductivity and is formed so as to cover the current-blocking layer and contact remaining parts of the upper surface of the p-type cladding base layer,
the interjacent layer being positioned between the current-blocking layer and the p-type cladding base layer so that a lower surface of the current-blocking layer is separated from an upper surface of the p-type cladding base layer, and the current-blocking layer (13) having a lower refractive index than the p-type cladding base layer (5) and the p-type buried cladding layer (7).

13. A semiconductor laser according to claim 12, wherein the p-type buried cladding layer has a higher refractive index of light than the current-blocking layer.

14. A semiconductor laser according to claim 11, wherein the p-type buried cladding layer has a higher refractive index of light than the current-blocking layer.

15. A semiconductor laser according to claim 10, wherein the p-type buried cladding layer has a higher refractive index of light than the current-blocking layer.

16. A semiconductor laser according to claim 9, wherein the p-type buried cladding layer has a higher refractive index of laser light than the current-blocking layer.

17. A semiconductor laser according to claim 8, wherein the p-type buried cladding layer has a higher refractive index of light than the current-blocking layer.

18. A semiconductor laser according to claim 7, wherein the p-type buried cladding layer has a higher refractive index of light than the current-blocking layer.

19. A semiconductor laser according to claim 6, wherein the p-type buried cladding layer has a higher refractive index of light than the current-blocking layer.

20. A semiconductor laser according to claim 5, wherein the p-type buried cladding layer has a higher refractive index of light than the current-blocking layer.

21. A semiconductor laser according to claim 4, wherein the p-type buried cladding layer has a higher refractive index of light than the current-blocking layer.

22. A semiconductor laser according to claim 3,
wherein the p-type buried cladding layer has a higher refractive index of light than the current-blocking layer.

23. A semiconductor laser according to claim 2,
wherein the p-type buried cladding layer has a higher refractive index of light than the current-blocking layer.

24. A semiconductor laser according to claim 1,
wherein the p-type buried cladding layer has a higher refractive index of light than the current-blocking layer.

25. A semiconductor laser manufacturing method, comprising:
a first process for successively forming an n-type cladding layer having n-type conductivity, an active layer, and a p-type cladding base layer having p-type conductivity on top of one another, before forming a current-blocking layer, which substantially has n-type conductivity, on specified parts of an upper surface of the p-type cladding base layer;
a second process for performing thermal cleaning in a presence of a specified gas after the first process has finished;
a third process for forming, after the second process has finished, a p-type buried cladding layer, which has p-type conductivity, so as to cover the current-blocking layer and contact remaining parts of the upper surface of the p-type cladding base layer,
the first process including:
a first subprocess for forming a region of the current-blocking layer that is adjacent to the interface between the p-type cladding base layer and the p-type buried cladding layer with a concentration (hereafter, "N1") of n-type carriers, wherein the current-blocking layer includes either $Al_{0.5}In_{0.5}P$ or $Al_xGa_{1-x})_{0.5}In_{0.5}P$, where $0.7<x<1$; and
a second subprocess for forming another region in at least part of the current-blocking layer with a concentration (hereafter, "N2") of n-type carriers, where N1<N2, and
wherein the current-blocking layer (13) has a lower refractive index than the p-type cladding base layer (5) and the p-type buried cladding layer (7).

26. A semiconductor laser manufacturing method according to claim 25,
wherein the first process produces the current-blocking layer by forming a first layer that contacts the p-type cladding base layer and a second layer on top of the first layer, a concentration of n-type carriers being N1 in the first layer and N2 in the second layer.

27. A semiconductor laser manufacturing method according to claim 26,
wherein the first process forms the first layer from a different composition of materials to the second layer.

28. A semiconductor laser manufacturing method according to claim 26,
wherein the first process produces one of the first layer and the second layer by forming sublayers from at least two different compositions of materials.

29. A semiconductor laser manufacturing method according to claim 26,
wherein the first process co-dopes the second layer with a p2 concentration of p-type carriers and an n2 (where n2>p2) concentration of n-type carriers, and N2=(n2−p2).

30. A semiconductor laser manufacturing method according to claim 29,
wherein $0cm^{-3} \leq N1 \leq 10^{17}cm^{-3}$ and $N2>10^{17}cm^{-3}$.

31. A semiconductor laser manufacturing method according to claim 28,
wherein $0cm^{-3} \leq N1 \leq 10^{17}cm^{-3}$ and $N2>10^{17}cm^{-3}$.

32. A semiconductor laser manufacturing method according to claim 27,
wherein $0cm^{-3} \leq N1 \leq 10^{17}cm^{-3}$ and $N2>10^{17}cm^{-3}$.

33. A semiconductor laser manufacturing method according to claim 26,
wherein $0cm^{-3} \leq N1 \leq 10^{17}cm^{-3}$ and $N2>10^{17}cm^{-3}$.

34. A semiconductor laser manufacturing method according to claim 25,
wherein $0cm^{-3} \leq N1 \leq 10^{17}cm^{-3}$ and $N2>10^{17}cm^{-3}$.

35. A semiconductor laser manufacturing method, comprising:
a first process for successively forming an n-type cladding layer having n-type conductivity, an active layer, and a p-type cladding base layer having p-type conductivity on top of one another, before forming a current-blocking layer, which substantially has n-type conductivity, on specified parts of an upper surface of the p-type cladding base layer;
a second process for performing thermal cleaning in a presence of a specified gas after the first process has finished;
a third process for forming, after the second process has finished, a p-type buried cladding layer, which has p-type conductivity, so as to cover the current-blocking layer and contact remaining parts of the upper surface of
the p-type cladding base layer,
the first process forming the current-blocking layer so as to include a region with n-type conductivity and a region with p-type conductivity, the first process including:
a first subprocess for forming a region with p-type conductivity adjacent to an interface between the p-type cladding base layer and the p-type buried cladding layer; and
a second subprocess for forming a region with n-type conductivity in at least part of a remainder of the current-blocking layer,
wherein the current-blocking layer (13) has a lower refractive index than the p-type cladding base layer (5) and the p-type buried cladding layer (7) and
wherein the current-blocking layer includes either $Al_{0.5}In_{0.5}P$ or $(Al_xGa_{1-x})_{0.5}In_{0.5}P$, where $0.7<x<1$.

36. A semiconductor laser manufacturing method, comprising:
a first process for successively forming an n-type cladding layer having n-type conductivity, an active layer, a p-type cladding base layer having p-type conductivity, and an interjacent layer that has p-type conductivity and contacts the first p-type cladding base layer on top of one another, before forming a current-blocking layer, which substantially has n-type conductivity, on an upper surface of the interjacent layer;
a second process for performing thermal cleaning in a presence of a specified gas after the first process has finished;
a third process for forming, after the second process has finished, a p-type buried cladding layer, which has p-type conductivity, so as to cover the current-blocking layer and contact remaining parts of the upper surface of the p-type cladding base layer, the interjacent layer being formed between the current blocking layer and the p-type cladding base layer so that a lower surface of the current-blocking layer is separated from an upper surface of the p-type cladding base layer, wherein the current-blocking layer (13) has a lower refractive index than the p-type cladding base layer (5) and the p-type buried cladding layer (7), and wherein the current-blocking layer includes either $Al_{0.5}In_{0.5}P$ or $(Al_xGa_{1-x})_{0.5}In_{0.5}P$, where $0.7<x<1$.

37. A semiconductor laser according to claim 2, wherein the second layer is co-doped with p-type impurities and n-type impurities and has substantially n-type conductivity, and such that the concentration of n-type carriers is N2.

38. A semiconductor laser manufacturing method according to claim 26, wherein the first process co-dopes the second layer with p-type impurities and n-type impurities, such that the concentration of n-type carriers is N2.

* * * * *